(12) United States Patent
Byars

(10) Patent No.: US 9,038,998 B2
(45) Date of Patent: May 26, 2015

(54) SUPPORT STRUCTURES AND CLAMPING SYSTEMS FOR SEMICONDUCTOR DEVICES DURING WIRE AND RIBBON BONDING OPERATIONS

(75) Inventor: Jonathan Michael Byars, Fountain Valley, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 305 days.

(21) Appl. No.: 13/510,151

(22) PCT Filed: Nov. 16, 2010

(86) PCT No.: PCT/US2010/056830
§ 371 (c)(1),
(2), (4) Date: May 16, 2012

(87) PCT Pub. No.: WO2012/096638
PCT Pub. Date: Jul. 19, 2012

(65) Prior Publication Data
US 2012/0274014 A1    Nov. 1, 2012

Related U.S. Application Data

(60) Provisional application No. 61/261,847, filed on Nov. 17, 2009.

(51) Int. Cl.
*B23Q 3/00* (2006.01)
*H01L 23/00* (2006.01)

(52) U.S. Cl.
CPC ............ *H01L 24/85* (2013.01); *H01L 24/78* (2013.01); *H01L 2224/48091* (2013.01); *H01L 2224/4813* (2013.01); *H01L 2224/48472* (2013.01); *H01L 2924/01029* (2013.01); *H01L 2224/78* (2013.01); *H01L 2224/4846* (2013.01); *H01L 2224/45014* (2013.01); *H01L 2224/78703* (2013.01); *H01L 2224/85205* (2013.01); *H01L 24/48* (2013.01); *H01L 24/97* (2013.01); CPC ........ *H01L 2224/48247* (2013.01); *H01L 2224/85206* (2013.01); *H01L 2924/00014* (2013.01); *H01L 24/34* (2013.01); *Y10S 269/903* (2013.01)

(58) Field of Classification Search
USPC .......................................... 269/287, 288, 903
See application file for complete search history.

(56) References Cited

U.S. PATENT DOCUMENTS 3,868,764 A  *  3/1975  Hartleroad et al. ........ 228/123.1
5,673,845 A      10/1997  Ball
(Continued)

FOREIGN PATENT DOCUMENTS

KR        20-0150081       7/1999
KR     10-2002-0049943     6/2002
(Continued)

OTHER PUBLICATIONS

International Search Report dated Jul. 30, 2012; International Patent Application No. PCT/US2010/056830.

*Primary Examiner* — Lee D Wilson
*Assistant Examiner* — Shantese McDonald
(74) *Attorney, Agent, or Firm* — Stradley Ronon Stevens & Young, LLP

(57) ABSTRACT

A support structure for supporting a semiconductor device during a bonding operation is provided. The support structure comprises a body portion defining an upper surface configured to support a semiconductor device during a bonding operation. The upper surface defines a constraining feature for constraining at least a portion of the semiconductor device during the bonding operation.

19 Claims, 14 Drawing Sheets

(56) References Cited

U.S. PATENT DOCUMENTS

| | | | |
|---|---|---|---|
| 6,062,459 A * | 5/2000 | Sabyeying | 228/4.5 |
| 6,454,158 B1 * | 9/2002 | Takahashi | 228/180.5 |
| 2011/0212572 A1 * | 9/2011 | Byars et al. | 438/106 |

FOREIGN PATENT DOCUMENTS

| | | |
|---|---|---|
| KR | 10-0401140 | 10/2003 |
| WO | WO2008-067242 | 6/2008 |

* cited by examiner

SUPPORT STRUCTURES AND CLAMPING SYSTEMS FOR SEMICONDUCTOR DEVICES DURING WIRE AND RIBBON BONDING OPERATIONS

CROSS-REFERENCE TO RELATED APPLICATIONS

This application claims the benefit of International Patent Application No. PCT/US 2010/056830filed on Nov. 16, 2010, which claims the benefit of U.S. Provisional Application No. 61/261,847filed on Nov. 17, 2009, the content of both of which is incorporated herein by reference.

FIELD OF THE INVENTION

The present invention relates to wire and ribbon bonding machines, and more particularly, to improved support structures for supporting a semiconductor device in connection with wire and ribbon bonding operations.

BACKGROUND OF THE INVENTION

In the processing and packaging of semiconductor devices, wire and ribbon bonding techniques are often used to provide electrical interconnection between locations within a package (e.g., between a die pad of a semiconductor die and a lead of a leadframe). For example, wire bonding machines (or ribbon bonding machines) are used to form wire loops (or ribbon interconnections) between respective locations to be electrically interconnected. Exemplary methods of forming the interconnections include ball bonding, wedge bonding, and ribbon bonding. An exemplary wedge or ribbon bonding sequence includes: (1) forming a first wedge/ribbon bond on a die pad of a semiconductor die; (2) extending a length of wire/ribbon in a desired shape between the die pad and a lead of a leadframe; (3) forming a second wedge/ribbon bond on the lead of the leadframe; and (4) severing the wire/ribbon to complete the wire/ribbon loop. In forming the bonds between (a) the respective portion of the wire/ribbon material and (b) the respective bond site (e.g., a die pad, a lead, etc.) varying types of bonding energy may be used including, for example, ultrasonic energy, thermosonic energy, thermocompressive energy, amongst others.

A continuous trend in the semiconductor industry is that global markets demand smaller devices at lower costs. One exemplary cost reduction strategy involves using less material in the devices, for example, using less copper material in the leadframe support structure which supports the semiconductor dice. This strategy tends to lead to the creation of highly populated leadframes which support the semiconductor dice (and are used to transport the semiconductor dice) through the manufacturing process. Highly populated leadframes tend to contain many rows and columns of semiconductor dice and other components, where the leadframe portions are connected to the leadframe matrix by connecting portions such as small and thin tie bars. The density and small sizes of the leadframe components makes properly constraining the portions of the semiconductor device (including leadframe portions, die portions, etc.) during the ultrasonic wire or ribbon bonding process very difficult. Clamps (e.g., finger clamps) are typically used to secure the leadframe to a support structure (positioned beneath the leadframe) during a bonding operation. Unfortunately, poor clamping (which may result from the density and arrangement of the components) tends to lead to an unreliable process, and therefore bonded components of a poor quality. For example, because the bonding process (e.g., ultrasonic bonding process) is highly dynamic, particularly for large wire and ribbon bonding, the device being bonded (including the leadframe) may be driven at high velocities similar in amplitude to the tip velocity of the bonding tool used to form the wire/ribbon bonds. In such a case, the relative displacement between the bonding tool and the semiconductor device may be decreased.

FIG. 1A is an overhead illustration of leadframe strip 100 supporting a plurality of semiconductor dice 102. FIG. 1B is a detailed view of the circled portion "1B" of FIG. 1A and illustrates exemplary semiconductor die 102 on heat sink 101 of leadframe 100. Leadframe 100 also includes: source lead 104; leads 104a, 104b, 104c; gate lead 104d; and tie bars 108. Openings 106 are defined between various portions of leadframe 100. It is desired to bond wires or ribbons between conductive locations on die 102 (e.g., die pads, not shown) and corresponding adjacent leads 104.

FIGS. 2A-2D illustrate a conventional approach for securing another leadframe 200, supporting a plurality of semiconductor dice 202, during a bonding operation. FIG. 2A illustrates device clamp 220 positioned above leadframe 200, where device clamp 220 includes flexible clamp fingers 212 that press portions of leadframe 200 within opening 220a of device clamp 220 against lower supporting structure 214 (e.g., anvil 214) during the bonding operation. FIG. 2B is a detailed view of FIG. 2A at circled portion "2B" showing clamp fingers 212 pressing against portions of leadframe 200. Semiconductor die 202 is secured to heat sink 201 of leadframe 200. Leadframe 200 also includes: source lead 204; leads 204a, 204b, 204c; gate lead 204d; and tie bars 208. Openings 206 are defined between various portions of leadframe 200. FIG. 2C is a cross-sectional view of FIG. 2B taken at line "2C-2C", and FIG. 2D is a detailed view of FIG. 2C at circled portion "2D" of FIG. 2C showing detail of clamp finger 212 pressing against lead 204 proximate die 202 (with the dotted portions being portions of leadframe 200 such as leads 204/tie bars 208). The constraint of leadframe 200 by device clamp 220 in this design is dependent upon the frictional coupling of leadframe 200 to anvil 214 provided by clamping caused by the normal force induced by the bending of clamp fingers 212. In many applications this frictional coupling is not sufficient to properly constrain leadframe 200, and therefore poor bonding tends to result.

Thus, it would be desirable to provide improved clamping systems for wire and ribbon bonding applications.

SUMMARY OF THE INVENTION

According to an exemplary embodiment of the present invention, a support structure for supporting a semiconductor device during a bonding operation is provided. The support structure includes a body portion, the body portion defining an upper surface configured to support a semiconductor device during a bonding operation. The upper surface defines a constraining feature for constraining at least a portion of the semiconductor device during the bonding operation.

According to another exemplary embodiment of the present invention, a clamping system for securing a semiconductor device during a bonding operation is provided. The clamping system includes a device clamp including a body portion, the body portion including a lower surface configured to contact a semiconductor device during a bonding operation. The lower surface defines a constraining feature for constraining at least a portion of the semiconductor device during the bonding operation.

The present invention may also be considered to be a wire and/or ribbon bonding system or machine. Such a system/ machine may include a support structure and/or clamping system as described herein, amongst other elements such as, for example, a bonding tool, an ultrasonic transducer carrying the bonding tool, a wire/ribbon supply for supplying the wire/ribbon to the bonding tool for bonding, a bond head assembly carrying the ultrasonic transducer, a material handling system for transporting the semiconductor devices (carried by a leadframe) during the bonding operation, amongst others.

The present invention may also be considered to be a method of securing a semiconductor device (e.g., including a leadframe) during a wire/ribbon bonding operation, or as a method of performing a wire/ribbon bonding operation including a step of securing the semiconductor device using the structures and techniques disclosed herein. Other steps of such methods are also described herein in connection with the inventive structures.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1A:
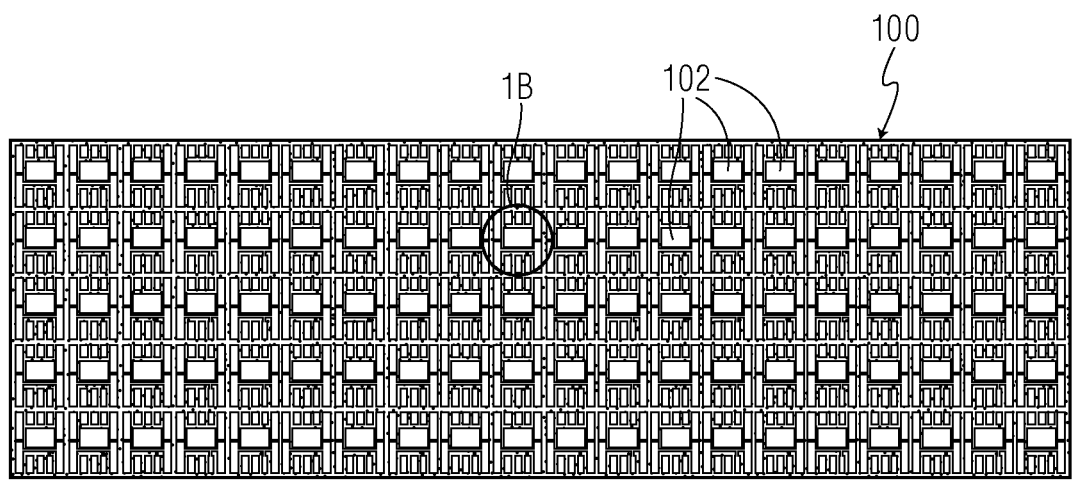
FIGS. 1A-1B are top view block diagrams of a leadframe supporting semiconductor dice in a connection with a power semiconductor package.
Figure 1B:
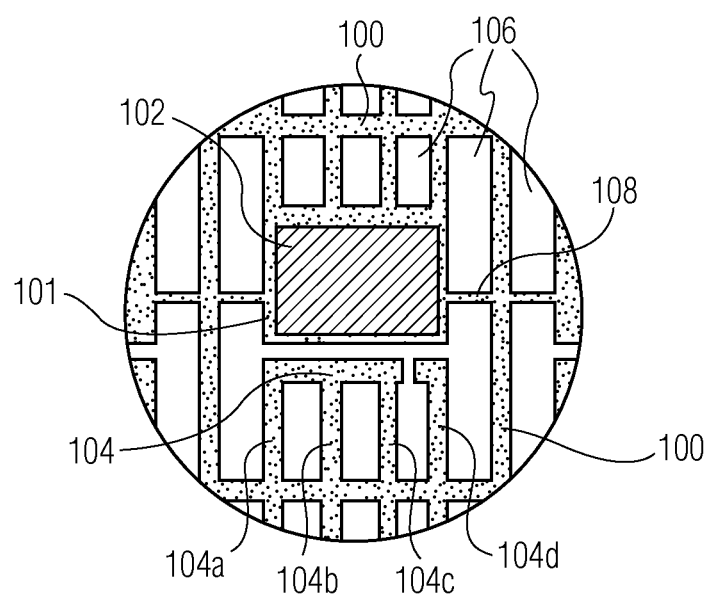
Figure 2A:
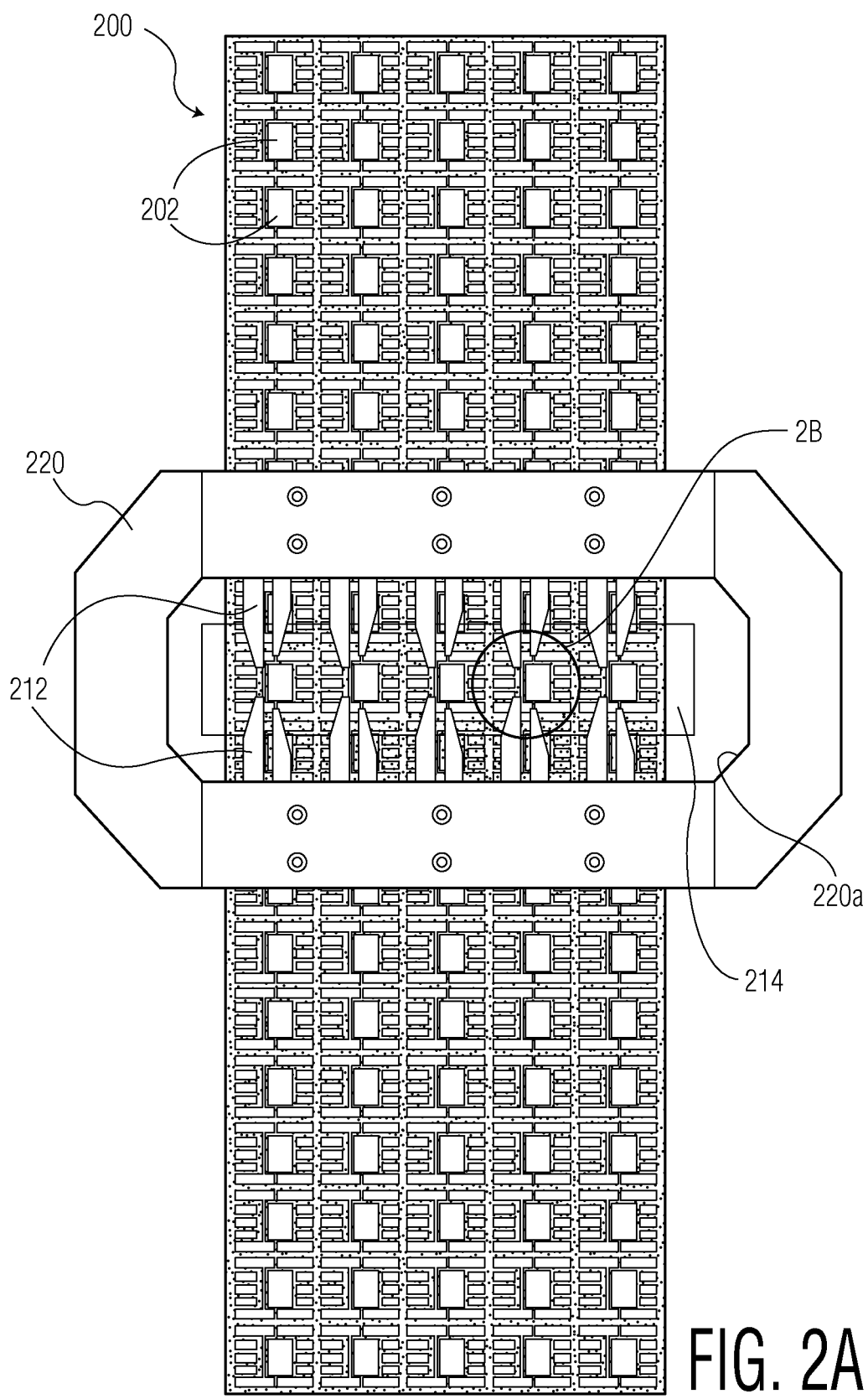
FIGS. 2A-2D are top and side view diagrams of a conventional clamping system used to constrain a power semiconductor device during a bonding operation.
Figure 2B:
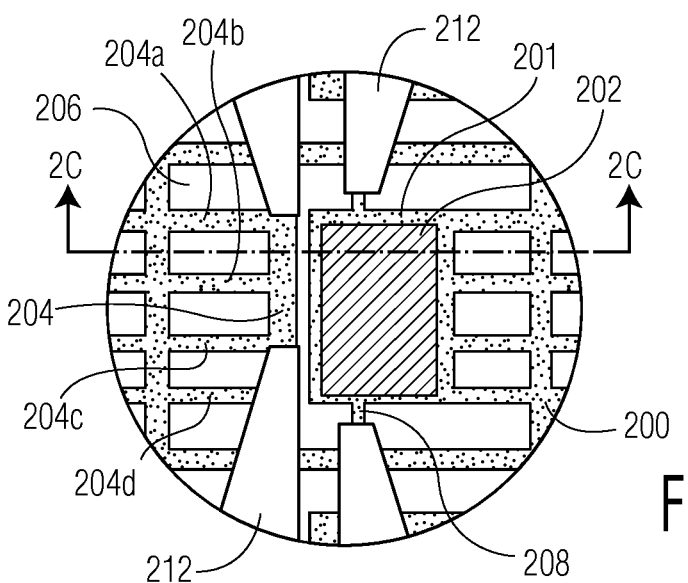
Figure 2C:
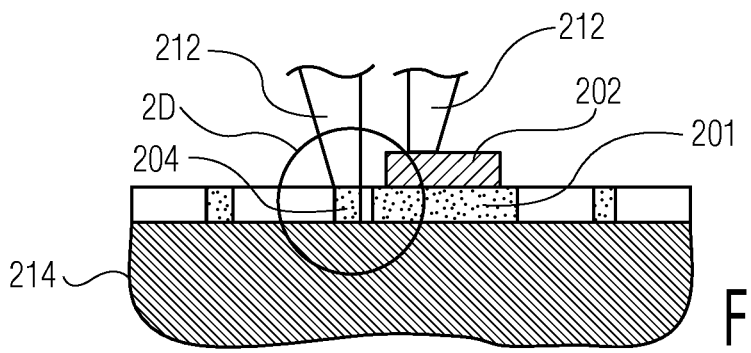
Figure 2D:
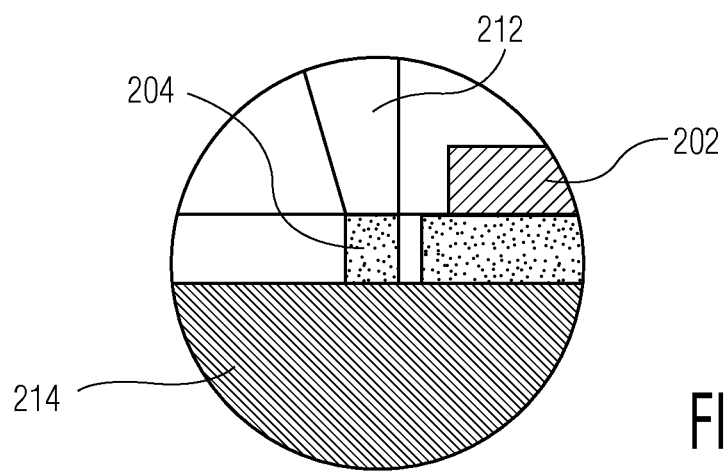

In accordance with certain exemplary embodiments of the present invention, a support structure for supporting a semiconductor device during a bonding operation is provided. The support structure (which may be provided in the form of an anvil or another structure) may include an upper surface defining a constraining feature for constraining at least a portion of the semiconductor device during the bonding operation. For example, the constraining feature may include raised portions (e.g., walls that are raised above a surface of the support structure) that at least partially surround a portion of the semiconductor device, where the portion of the semiconductor device may be a lead or other portion (e.g., a tie-bar, a heat sink, a die paddle, etc.) of the leadframe.

As used herein, the term "body portion" is intended to refer to any structure on which the constraining features are provided (or integrated with). Examples of such body portions include top layer 342 (in FIG. 3A-3D), support structure 640 (in FIGS. 6A-6F), top layer 742 (in FIGS. 7A-7C), support structure 740' (in FIG. 7D), support structure 840 (in FIGS. 8A-8D), top layer 942 (in FIGS. 9A-9B), top layer portions 942a, 942b (in FIGS. 9C-9D), top layer 1042 (in FIGS. 10A-10B), top layer portions 1142a, 1142b (in FIGS. 11A-11B), and device clamp 1220 (in FIGS. 12A-12B).

In certain exemplary embodiments, the support structure takes the form of an anvil or the like which includes geometry on its upper surface (e.g., geometry including a contraining feature such as a wedge-shaped structure including walls defining a valley, etc.) configured to mate with a portion of a leadframe of a semiconductor device. With the portion of the leadframe (e.g., a lead, a tie-bar, a heat sink, a die paddle, etc.) mated with the constraining feature, the potential for the leadframe (or device structure) to vibrate freely and/or unpredictably during ultrasonic excitation by the bonding tool is substantially reduced.

Figure 3A:
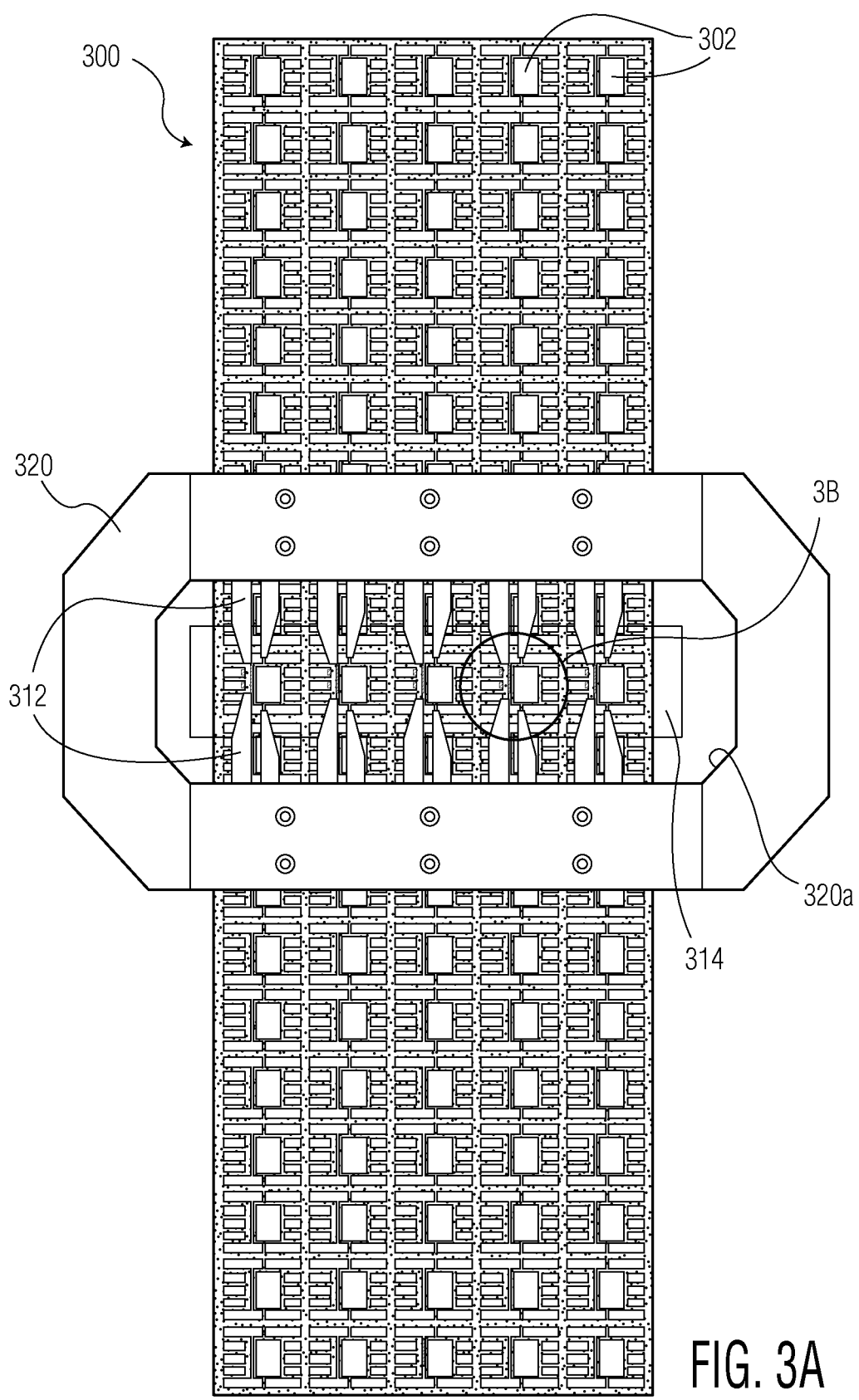
FIGS. 3A-3D are top and side view diagrams of a clamping system in accordance with an exemplary embodiment of the present invention.
Figure 3B:
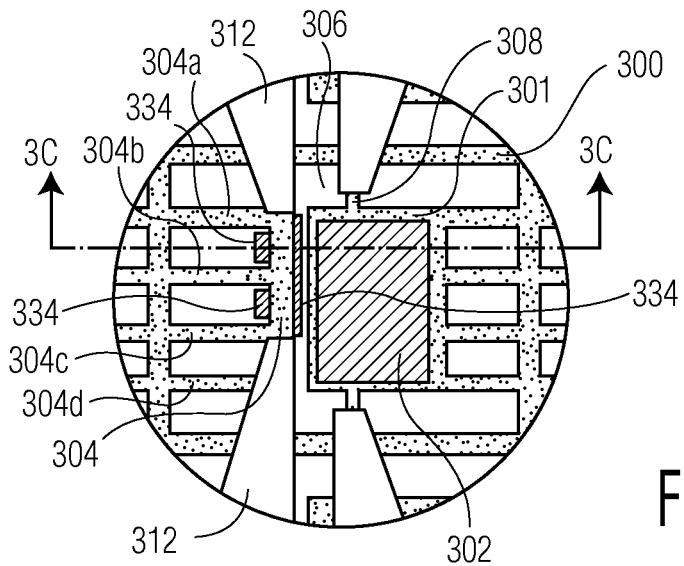
Figure 3C:
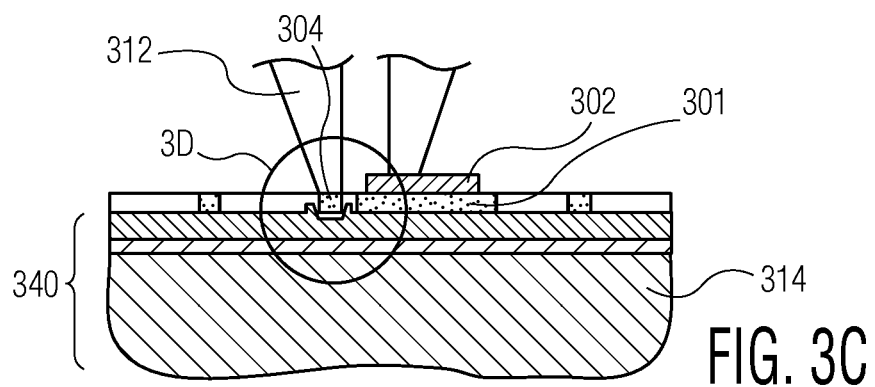

In such an exemplary design, the support structure (with the constraining geometry) is positioned beneath the leadframe during a bonding operation. A device clamp (e.g., a device clamp including clamp fingers, a window clamp, etc.) applies pressure and/or downward force, thereby pushing the leadframe down toward the support structure. Such a clamping system forces desired portions of the leadframe to mate with the constraining geometry of the support structure. For example, FIG. 3A is a top view illustrating device clamp 320 (defining opening 320a) including clamp fingers 312 configured for pressing downward on certain portions of leadframe 300 proximate die 302 against support structure 314 (e.g., anvil 314) during the bonding operation. FIG. 3B is a detailed view of FIG. 3A at circled portion "3B" of FIG. 3A showing clamp fingers 312 pressing against portions of leadframe 300. Semiconductor die 302 (e.g., a power semiconductor die, which together with the corresponding portions of leadframe 300, shall be considered a power semiconductor device) is secured to heat sink 301 of leadframe 300. Leadframe 300 also includes: source lead 304; leads 304a, 304b, 304c; gate lead 304d; and tie bars 308. Openings 306 are defined between various portions of leadframe 300. Wedge-shaped constraining feature 334 is shown partially surrounding source lead 304 pressed down by clamp fingers 312 (e.g., also see FIGS. 3C-3D). FIG. 3C is a cross-sectional view of FIG. 3B taken along line "3C-3C" through die 302 (with the dotted portions being portions of leadframe 300 with clamp fingers 312 pressing against them generally proximate die 302, while supported by support structure 340). As such FIG. 3C, and the detailed view provided in FIG. 3D (at the circled portion "3D" in FIG. 3C), illustrates a portion of clamp finger 312 pressing on a portion of leadframe 300 (e.g., source lead 304). Support structure 340 for leadframe 300 includes base 314, intermediate adhesive layer 330, and upper layer 342 having upper surface 332. In this illustration, upper layer 342 includes constraining feature 334 having a wedge shape. Wedge-shaped constraining feature 334 includes walls 336 which define valley 362. Feature 334 directs source lead 304 into valley 362, and constrains source lead 304 during the bonding operation. It is noted that constraining feature 334 may be separated from an adjacent portion of leadframe 300 by gap labeled as "gap" (e.g., see FIG. 3D) to account for tolerances in the design.

In one example, support structure 340 (or any support structure or clamping system of the present invention) may be formed partially or entirely from an insulative material such as a ceramic material (e.g., a technical engineering ceramic). Examples of ceramic materials include high percentage alumina (e.g., >96% alumina), zirconia toughened alumina, silicon carbide, silicon nitride, partially stabilized zirconias such as yttria-tetragonal zirconia polycrystal (Y-TZP) and magnesia partially stabilized zirconia, amongst others. Such materials may be used for support structure 340 because of their low wear rate under ultrasonic scrubbing and because of their high fracture toughness (K(Ic)). Examples of non-ceramic materials or hybrid ceramic materials that may be used to form support structure 340 (or any support structure or clamping system of the present invention) include cermets such as tungsten carbide bound with cobalt (WC), and silicon carbide whisker reinforced ceramic composites. Such materials also exhibit high fracture toughness and flexural strength, and also tend to be relatively wear resistant to ultrasonic scrubbing. Exemplary ranges for the fracture toughness (K(Ic)) of the material of a support structure or clamping system of the present invention are: greater than 4 Mpa $m^{1/2}$; greater than 8 Mpa $m^{1/2}$; greater than 12 Mpa $m^{1/2}$; greater than 15 Mpa $m^{1/2}$. Exemplary ranges for the flexural strength of the material of a support structure or clamping system of the present invention are: greater than 300 MPa; greater than 600 MPa; greater than 900 MPa; greater than 1200 MPa; and greater than 1500 MPa.

Other materials, such as metals, may be used for support structure 340 (or any support structure or clamping system of the present invention). Metals such as carbon steel exhibit high mechanical strength and relatively high wear resistance to ultrasonic scrubbing. For example, alloy 440C stainless steel or D7 tool steel may be suitable metals.

For example, wedge-shaped constraining feature 334 (or another constraining feature) may be added to support structure 340 as a separate piece, or may be machined (or otherwise formed) into upper surface 332 of support structure 340. When in contact with leadframe 300 (supported by support structure 340), clamp fingers 312 of device clamp 320 cause portions of leadframe 300 (e.g., source lead 304, other leads, tie-bars 308, etc.) to be seated in constraining feature(s) 334 (e.g., wedge-shaped constraining feature(s) 334) of support structure 340.

As will be explained in more detail below, support structure 340 may either be formed from a single unitary piece of material, or from multiple pieces secured together. For example, a ceramic piece (e.g., Y-TZP ceramic or others) including upper surface 332, defining one or more constraining features 334 (with or without adhesive layer 330), may be secured to base 314 that is comprised of a less expensive base material (e.g., a metal) for mounting into the wire bonding machine, thereby minimizing the amount of expensive ceramic material used.

An exemplary clamping process will now be described. The semiconductor device (e.g., leadframe 300 including a plurality of dice 302) is indexed into a clamping position by a transport system (e.g., a material handling system) of the wire bonding machine (e.g., see FIG. 3A). Then the support structure (e.g., anvil 314 including upper surface 332 with constraining features 334) is raised to be substantially flush with the bottom surface of leadframe 300 (e.g., using a cam system, or other system). Device clamp 320, including clamp fingers 312, is then lowered to the upper surface of the leadframe (e.g., using a cam system, or other system). Clamp fingers 312 are thus forced down and may bend to produce a clamping force that secures leadframe 300 against support structure 340, which may also push certain parts of the leadframe (e.g., source lead 304, other leads, tie-bars 308, a heat sink, a die paddle, etc.) into constraining features (e.g., feature 334) of support structure 340 (e.g., anvil 340) (e.g., see FIGS. 3B-3D).

Due to part tolerances, the leadframe features (e.g., leads 304) may not be aligned with the constraining feature. For example, as the clamp fingers travel downward, a given portion of the leadframe structure may contact one wall/face of the constraining feature/wedge. The angle of this wall/face may force the leadframe feature to bend slightly under load from the clamp finger, thereby substantially centering the leadframe portion in the constraining feature/wedge.

According to certain exemplary embodiments of the present invention, the constraining features may be placed above the leadframe (e.g., in connection with a device clamp or the like) (e.g., see FIGS. 12A-12B discussed below) as opposed to the constraining features being part of the support structure below the device clamp (e.g., see FIGS. 3A-3D). In such a case, the support structure of the leadframe may be raised, forcing portions of the leadframe structure to be received by the constraining features/geometry in the upper structure (e.g., device clamp 1220 in FIGS. 12A-12B). In one implementation of this design the upper structure may be formed from a single piece of material with the constraining features formed into a lower surface of the device clamp. Alternatively, the device clamp (or other upper structure) may be formed from multiple pieces of material, where the lower surface is formed from a material including the constraining features. In such a case the support structure beneath the leadframe may include a compliant material on top of a base material, with a thin/flexible metallic layer/plate (e.g., stainless steel) on top of the compliant material. As such, the stainless steel plate may have structures machined (or otherwise formed) into its upper surface to contact the respective portions of the leadframe which may be offset from the main datum of the bottom surface of the leadframe. This structure may be pushed into the leadframe, thereby forcing the desired areas to mate with the constraining features in the device clamp.

Compared to conventional designs, the new support structures and device clamps described herein may rely less on the design of the clamp fingers, or other like structures, to constrain the leadframe components that will undergo ultrasonic bonding. For example, the clamp fingers may be used to place respective portions of the leadframe within corresponding constraining features (e.g., wedge shaped features 334 of support structure/anvil 340). It is desirable that the constraining features "constrain" the relevant portions of the leadframe at least in the direction of the application of ultrasonic energy (i.e., in the direction of bonding tool scrub). Of course, the constraining features may constrain the portions of the leadframe in a number of directions as is desired.

Figure 12A:
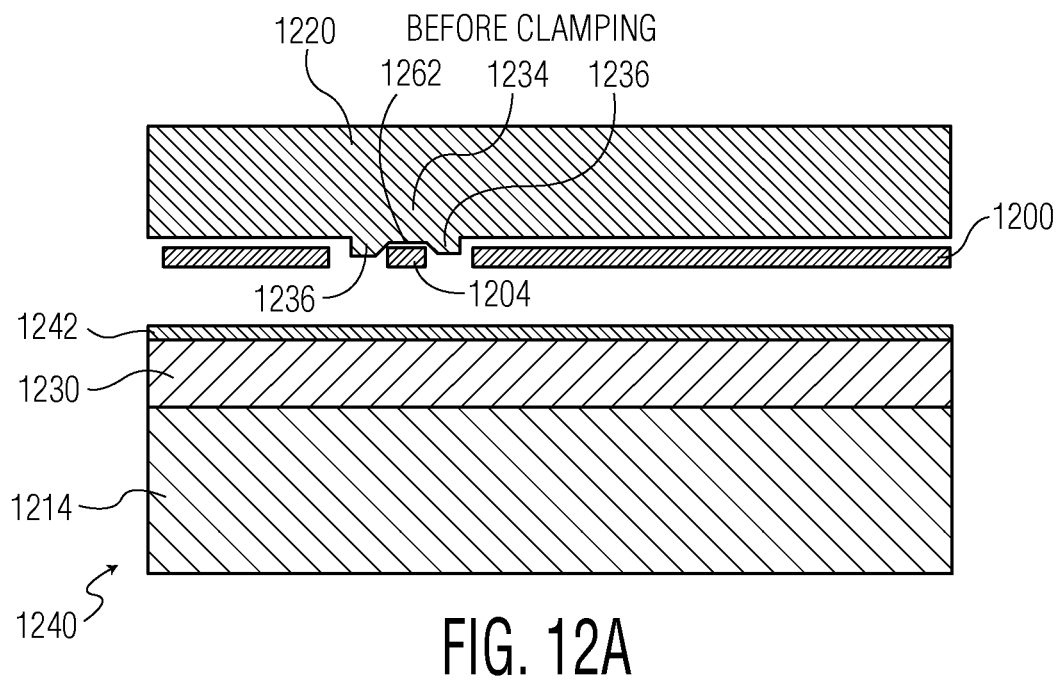
FIGS. 12A-12B are block diagram views of another support structure and device clamp in accordance with an exemplary embodiment of the present invention.
Figure 12B:
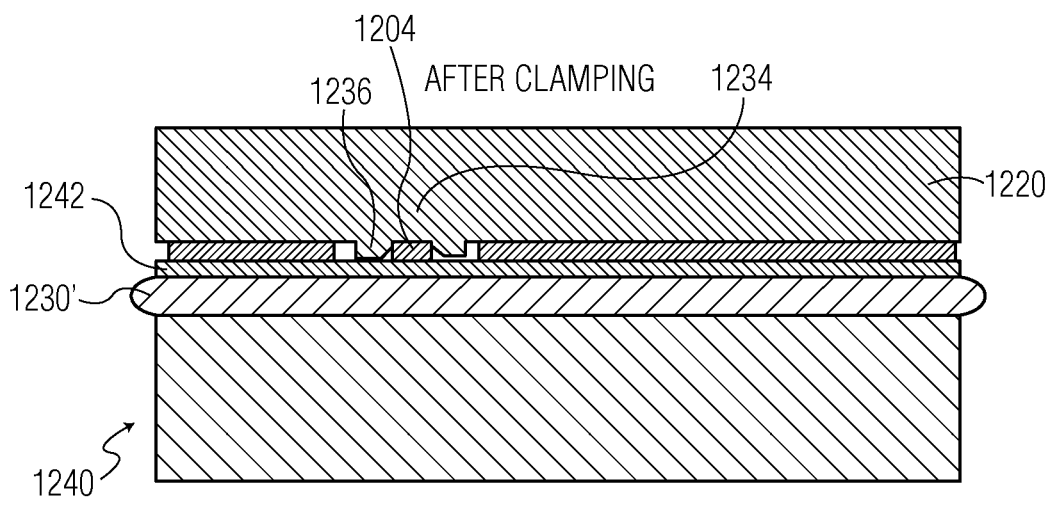

By providing the constraining features in the support structure (or in device clamp 1220 as illustrated in FIGS. 12A-12B) a more robust bonding process is provided that is somewhat independent of clamp finger design and the force applied by the clamp fingers. This is particularly beneficial in certain cases where clamp fingers can not be provided. As is understood by those skilled in the art, various locations (e.g., bonding locations, bonding tool locations, other hardware locations, etc.) in a bonding operation require adequate clearance such that the bonding operation may be properly performed. Thus, no clamp fingers or similar clamping structures may be provided in these areas. In accordance with the present invention, local constraint of the semiconductor device (e.g., relevant portions of leadframe 300) is possible directly beneath the area of the bond and also in areas requiring clearance for the bond tool. This is particularly advantageous in certain small devices where much of the device area is free of clamping to provide clearance and positions for bonded wires/ribbons.

In accordance with the present invention, experimentation was conducted to compare certain process variables using conventional clamping structures and certain support structures according to the present invention. The variables tested include: (1) wire/ribbon deformation, and (2) shear strength of the bonded wire/ribbon. The experimentation was conducted by varying the clamping force on the two systems through a range of positions while keeping all other process parameters constant. Then the (1) wire/ribbon deformation, and (2) shear strength of bonded wire/ribbon were measured to gauge the sensitivity of the conventional and inventive clamping systems to the variations.

Figure 4A:
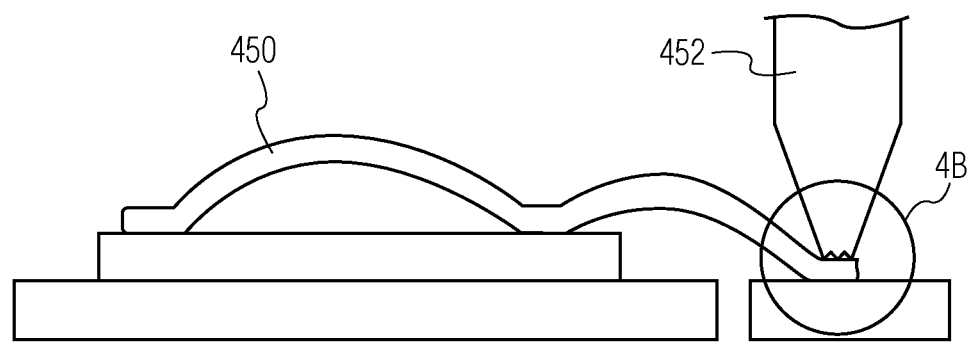
FIGS. 4A-4C are side view block diagrams of a portion of a semiconductor package useful for illustrating ribbon bonding deformation.
Figure 4B:
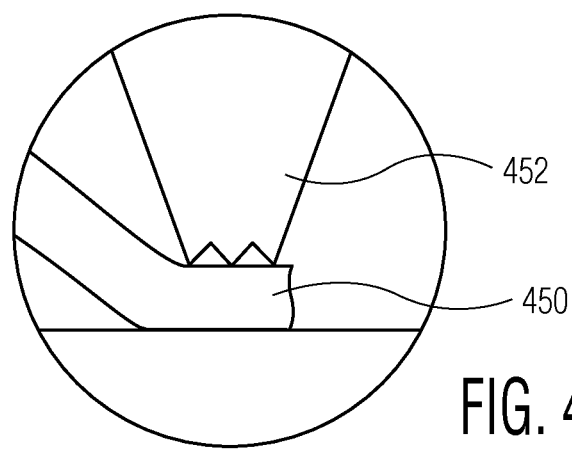
Figure 4C:
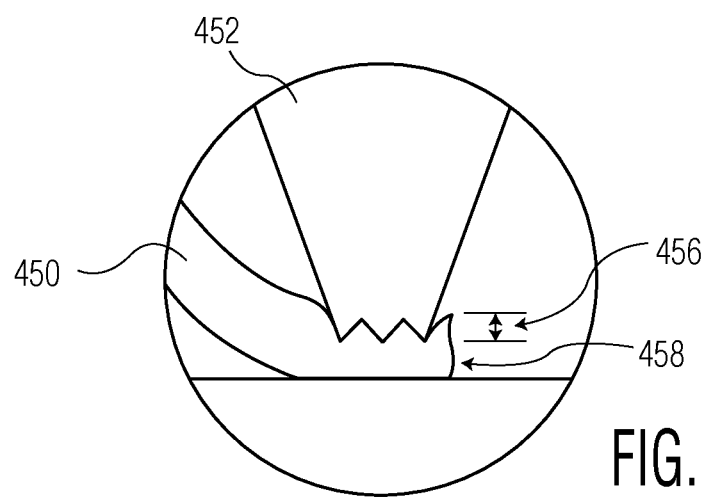

FIGS. 4A-4C illustrate the deformation measurement that was performed, where deformation for such a ribbon bonding process is defined as distance 456 into ribbon material 450 that the teeth of tool 452 traverse during the formation of bond 458 (e.g., see FIG. 4C). FIG. 4B is a detailed view of FIG. 4A at circled portion "4B", as bonding tool 452 first contacts ribbon material 450. FIG. 4C is the same view as FIG. 4B but after formation of bond 458 with the penetration of the teeth of tool 452 by distance 456.

Figure 5:
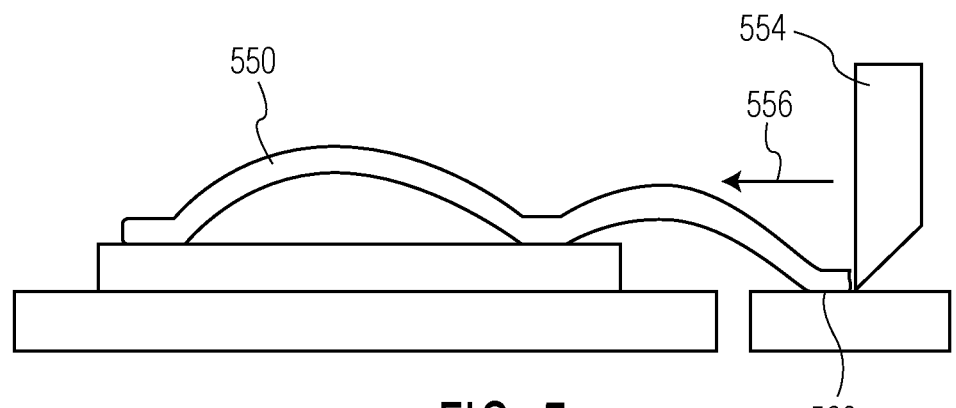
FIG. 5 is a side view block diagram of a portion of a semiconductor package useful for illustrating a shear test of a ribbon bond.

FIG. 5 illustrates a shear test wherein shear tool 554 is dragged/moved in direction 556 through bond interface 568 of ribbon material 550. The resultant force is measured and used to create a map of force and displacement. In connection with the force and displacement process variables, the conventional clamping system (e.g., see FIGS. 2A-2D wherein the support structure is a standard anvil) exhibited inconsistency in deformation values, and low shear test values that are highly dependent on the clamping force. In contrast, the inventive system (e.g., see FIGS. 3A-3D using support structure 340 with wedge-shaped constraining features 334) exhibited much more consistent and controlled deformation values, and increased shear test values, that are substantially independent of the clamping force applied.

Figure 6A:
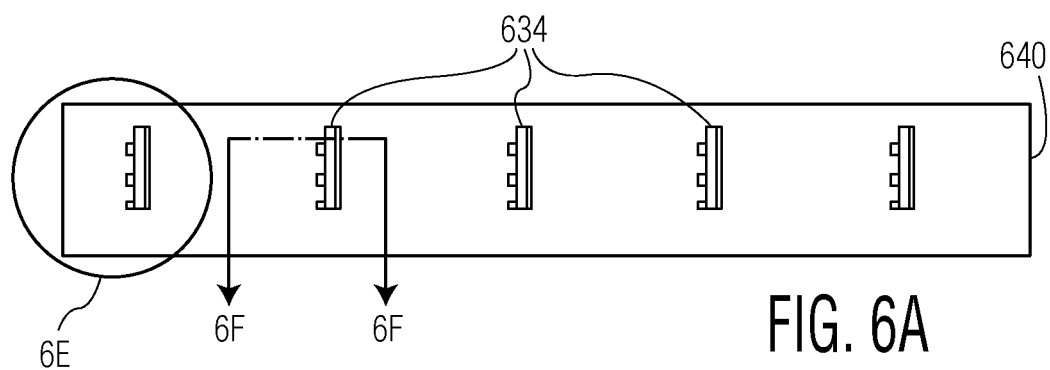
FIGS. 6A-6F are various block diagram views of a support structure for supporting a semiconductor device in accordance with an exemplary embodiment of the present invention.
Figure 6B:
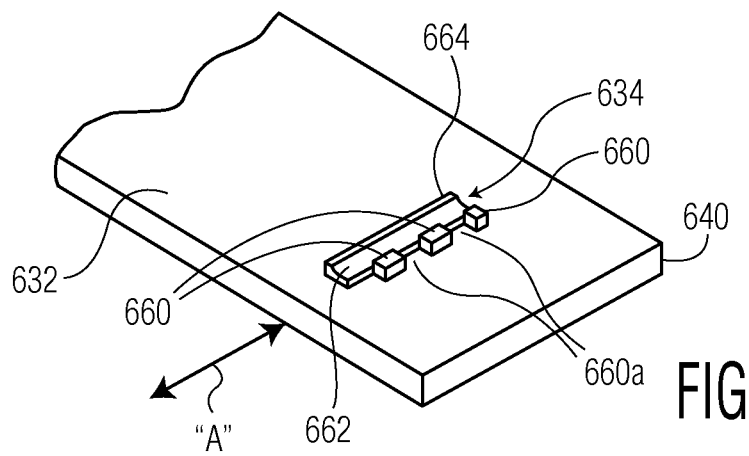
Figure 6C:
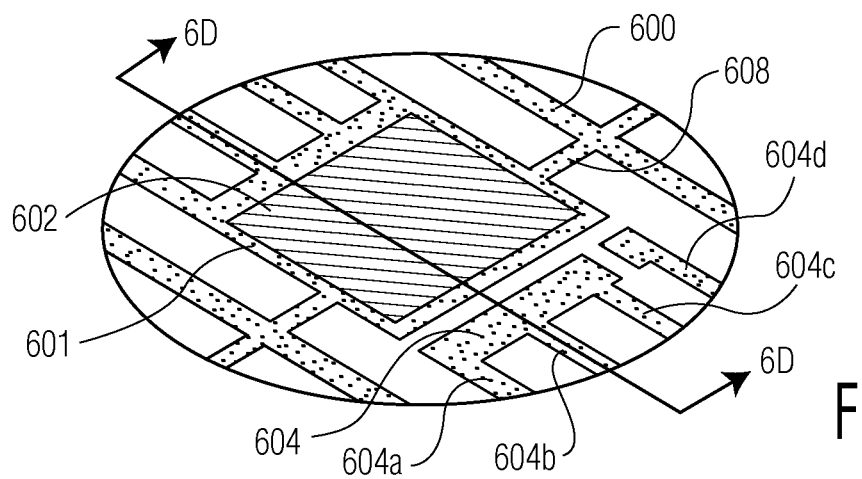
Figure 6D:
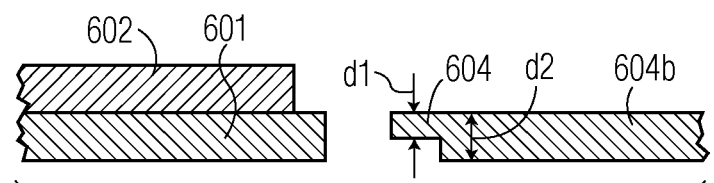
Figure 6E:
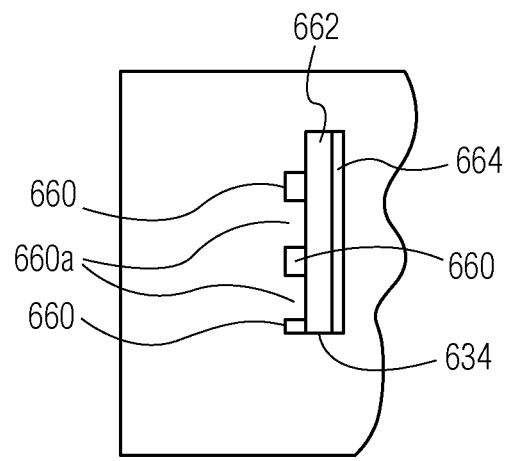
Figure 6F:
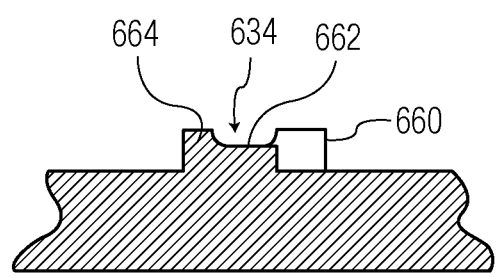

FIGS. 6A-6F illustrate support structure 640 for supporting a semiconductor device (e.g., a portion of leadframe 300 and an associated semiconductor die) in connection with a bonding operation. FIG. 6A is a top view of support structure 640 with 5 constraining features 634 (note that the 5 constraining features 634 match the 5 device wide leadframe 300 illustrated in FIG. 3A). FIG. 6B is a perspective view of an end portion of support structure 640 at circle "6E" of FIG. 6A. More specifically, FIG. 6B illustrates constraining feature 634 raised above upper surface 632, where feature 634 includes wall 664 and 3 guides 660 (with gaps 660a therebetween) collectively defining valley 662. Valley 662 is configured to receive a portion of a leadframe (e.g., a source lead of a leadframe), while gaps 660a between guides 660 are configured to receive an adjacent portion of the leadframe. In this regard, the leadframe is at least partially constrained from motion during the wire/ribbon bonding process. More specifically, the leadframe may be constrained along direction "A" by the portion received within gaps 660a, and/or may be constrained in a direction perpendicular to direction "A" through wall 664 and guides 660. For example, one of these directions (e.g., direction "A" or the a direction perpendicular to direction "A") may be configured to be the direction of ultrasonic scrubbing of the tip of a bonding tool. FIG. 6C is a perspective view of an exemplary semiconductor device including portions of a leadframe configured to be received by constraining feature 634. The semiconductor device includes semiconductor die 602 secured to heat sink 601 of leadframe 600. Leadframe 600 also includes: source lead 604; leads 604a, 604b, 604c; gate lead 604d; and tie bars 608. Valley 662 is configured to receive source lead 604. A portion of each of leads 604b and 604c are configured to be received within gaps 660a of guides 660. FIG. 6D is a cross sectional view of a portion of the leadframe of FIG. 6C taken along line "6D-6D". FIG. 6D illustrates that the leadframe has been processed (e.g., etched) more beneath source lead 604 such that source lead has a depth d1 that is smaller than depth d2 of lead 604b (and of other portions of the leadframe). FIG. 6E is a detailed view of circle "6E" of FIG. 6A, and FIG. 6F is a detailed view taken along line "6F-6F" of FIG. 6A showing guide 660, valley 662, and wall 664 of constraining feature 634. In FIGS. 6A-6F, the remainder of support structure 640 is not shown and may be any type of structure.

Figure 7A:
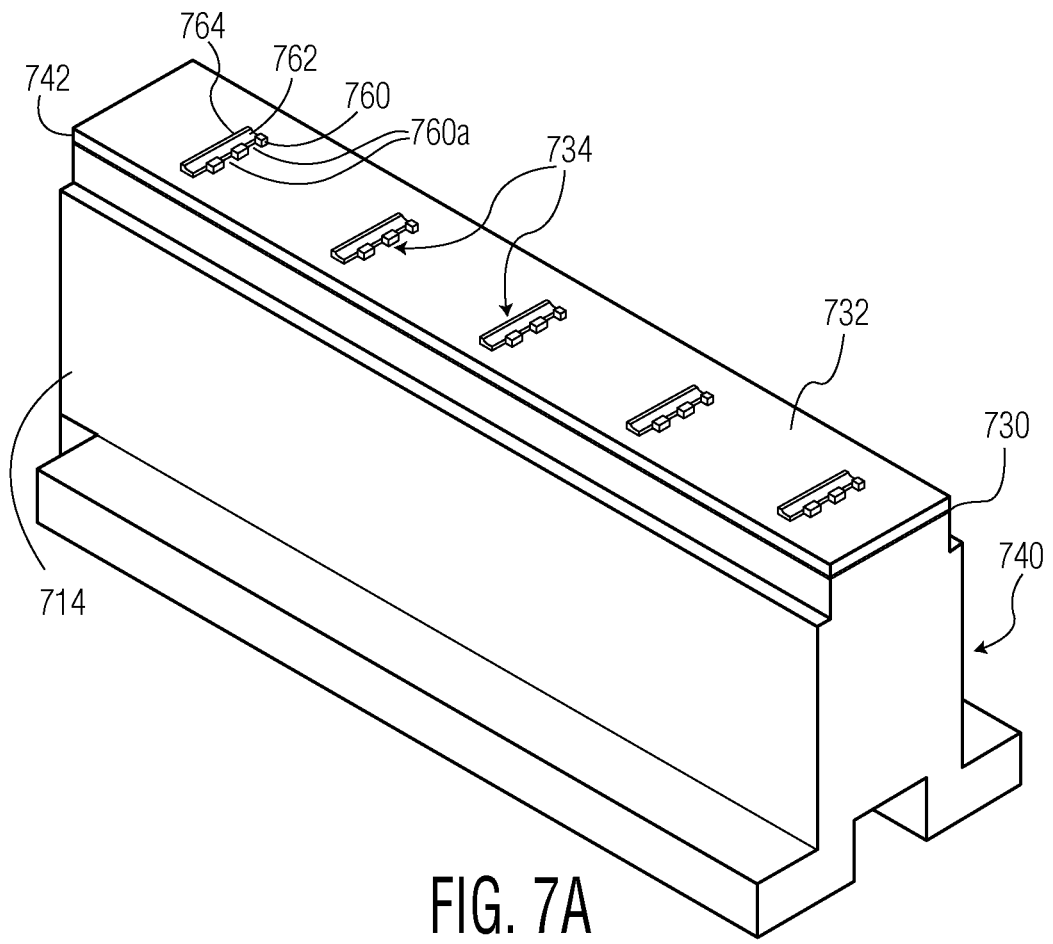
FIGS. 7A-7D are various block diagram views of other support structures for supporting a semiconductor device in accordance with exemplary embodiments of the present invention.
Figure 7B:
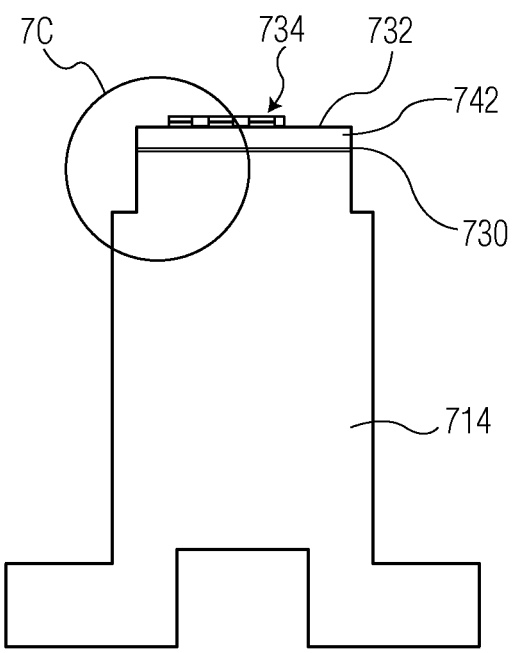
Figure 7C:
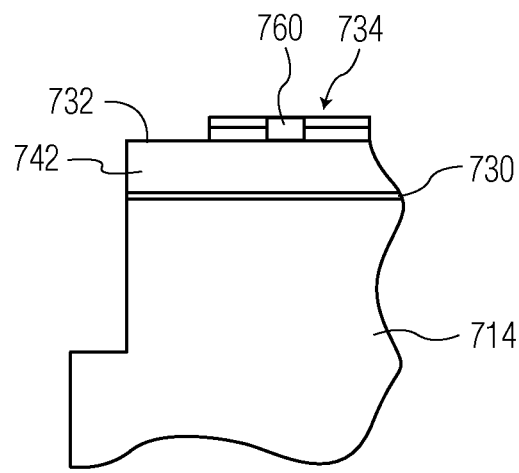
Figure 7D:
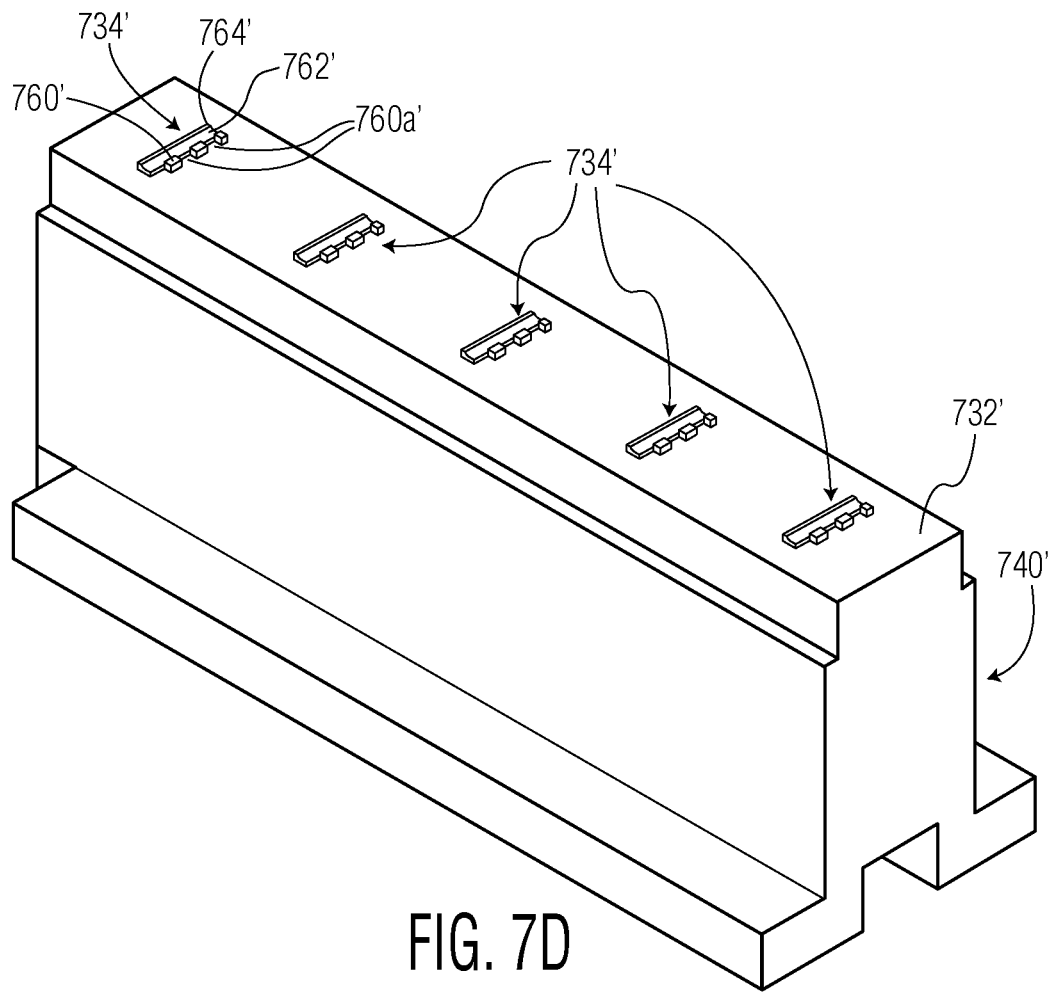

In FIG. 7A, support structure 740 includes base 714, adhesive layer 730 on top of base 714, and top layer 742 (defining upper surface 732) on top of adhesive layer 730. FIG. 7B is an end view of FIG. 7A, and FIG. 7C is a detailed view of FIG. 7B at circle "7C" showing guide 760 of part of restraining feature 734. Top layer 742 includes upper surface 732 and is substantially the same as support structure 640 shown in FIGS. 6A-6B and 6E-6F, and as such, a detailed discussion is omitted herein. As provided above, the materials of support structure 740 shown in FIGS. 7A-7C may vary. For example, base 714 may be formed of a relatively inexpensive material (e.g., a metal such as stainless steel), and layer 730 may be formed from a compliant material or adhesive such as a cyanoacrylate adhesive or a brazing compound such as a trimetallic braze. Furthermore, top layer 742 may be mechanically fastened to base 714 using fasteners (e.g., screws) or a clamp plate in which case adhesive layer 730 may be omitted. Top layer 742/support structure 740 (i.e., support structure 640 shown in FIGS. 6A-6B and 6E-6F) may be formed from an insulative material, such as a ceramic material. An example of such a material is the previously described Y-TZP ceramic, amongst other materials. Constraining features 734 (including wall 764 and guides 760 defining valley 762 therebetween, and gaps 760a between guides 760) may be formed from a unitary piece of material including top layer 742, or may be distinct structures secured to top layer 742. In contrast, FIG. 7D illustrates a one piece support structure 740' where the structure is formed/machined from a unitary piece of material, for example, a ceramic material such as the above mentioned Y-TZP, amongst others. Structure 740' includes constraining features 734' (including wall 764', and guides 760', defining valley 762' therebetween, and gaps 760a' between guides 760') on upper surface 732', where features 734' are substantially similar to features 734 described above with respect to FIGS. 7A-7C.

Figure 8A:
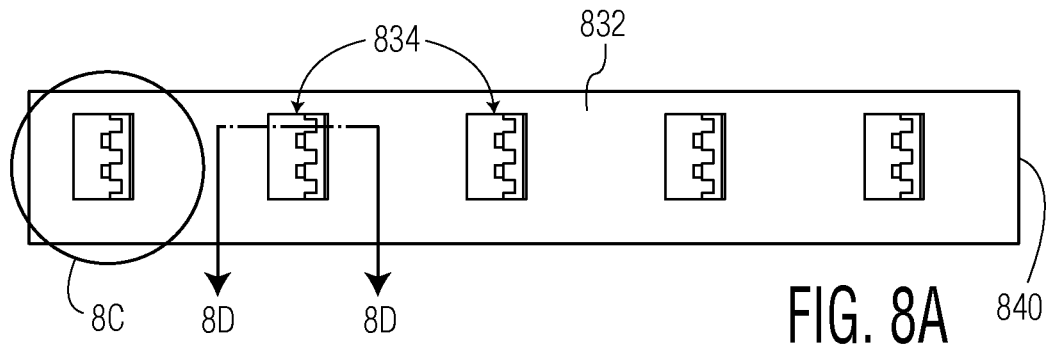
FIGS. 8A-8D are various block diagram views of yet another support structure for supporting a semiconductor device in accordance with an exemplary embodiment of the present invention.
Figure 8B:
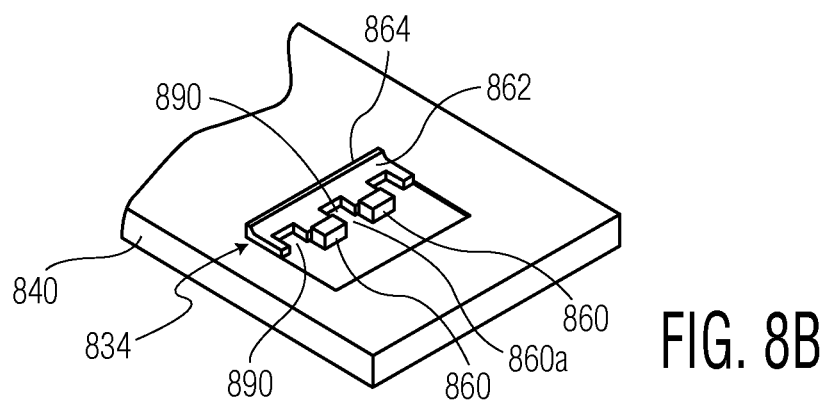
Figure 8C:
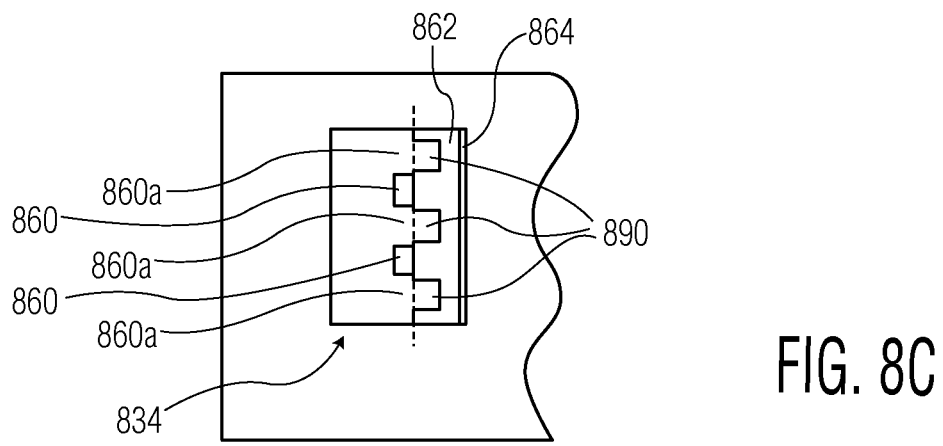
Figure 8D:
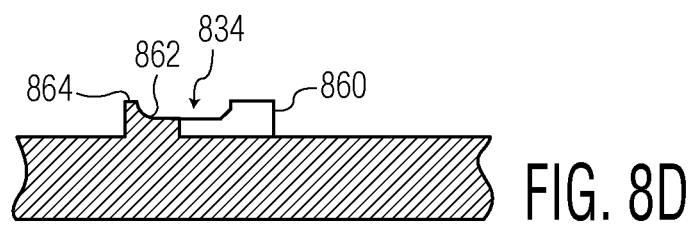

FIGS. 8A-8D illustrate another support structure 840 defining upper surface 832. FIG. 8B is a perspective view of circle "8C" of FIG. 8A; FIG. 8C is a detailed view of FIG. 8A at circle "8C"; and FIG. 8D is a cross-sectional view of FIG. 8A taken along line "8D-8D". Structure 840 shown in FIGS. 8A-8D includes constraining features 834 configured to receive a portion of a leadframe that is "offset" from the general leadframe matrix plane. That is, the leadframe may have been etched (or otherwise processed) to have certain portions offset, or above (or in some applications, below), adjacent portions of the leads/leadframe. Support structure 840 in FIGS. 8A-8D is configured to receive these offset portions of a lead of a leadframe in constraining feature 834. Recesses 890 are provided to allow clearance for other portions of the leadframe (e.g., leads similar to 604a, 604b, and 604c in FIGS. 6C-6D) to bend freely such as not to interfere with proper seating of the portion of the leadframe (e.g., a source lead similar to lead 604 in FIGS. 6C-6D) within constraining feature 834. Otherwise, the functions of constraining feature 834 (having wall 864 defining valley 862, e.g., see FIG. 8D) and guides 860 (with gaps 860a therebetween) are similar to analogous structures described in FIGS. 6A-6F.

Figure 3D:
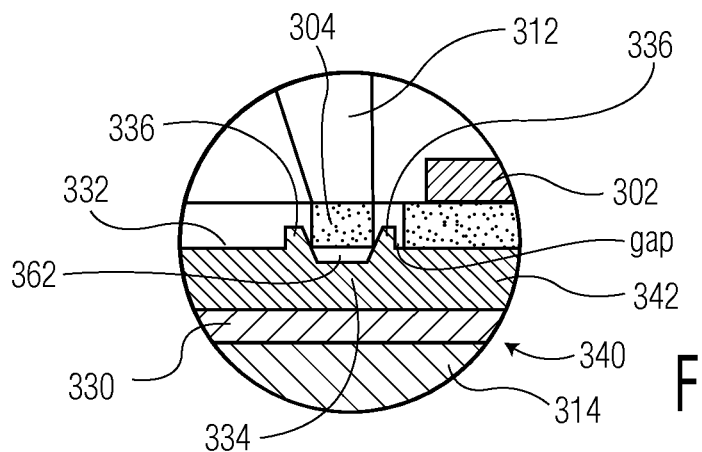
Figure 9A:
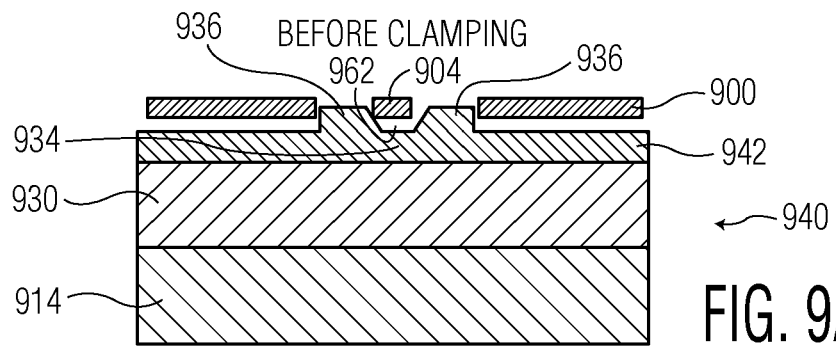
FIGS. 9A-9D are block diagram views illustrating yet another support structure for supporting a semiconductor device in accordance with an exemplary embodiment of the present invention.
Figure 9B:
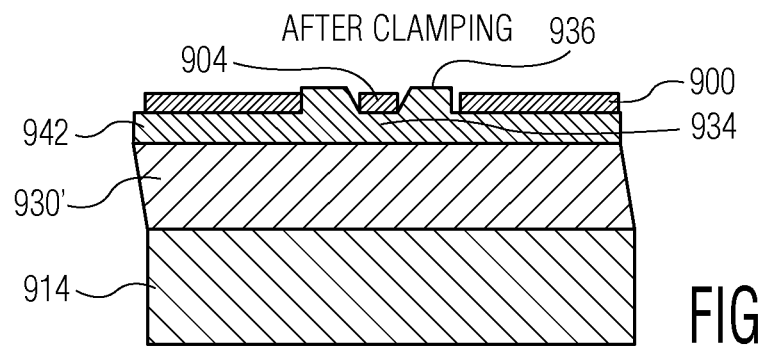

FIGS. 9A-9B illustrate support structure 940 similar to structure 340 shown in FIG. 3D. In FIG. 9A, a semiconductor device includes leadframe 900 (where semiconductor die/dice on leadframe 900 are not shown for simplicity), where leadframe 900 has not yet been clamped to support structure 940. Support structure 940 includes base 914 (e.g., comprised of a metallic composition), compliant layer 930 (e.g., a visco-elastic polymer), and top layer 942. Top layer 942 includes constraining feature 934 (e.g., a wedge-shaped feature 934 having walls 936 defining valley 962) configured to receive lead 904 of leadframe 900. FIG. 9B illustrates the application of a clamping force to clamp lead 904 into constraining feature 934 of layer 942. As lead 904 contacts sloped walls 936 of constraining feature 934 the resultant shear force acting on compliant layer 930' effectively "self-aligns" constraining feature 934 of layer 942 with lead 904 (of leadframe 900) by movement of layer 942.

Figure 9C:
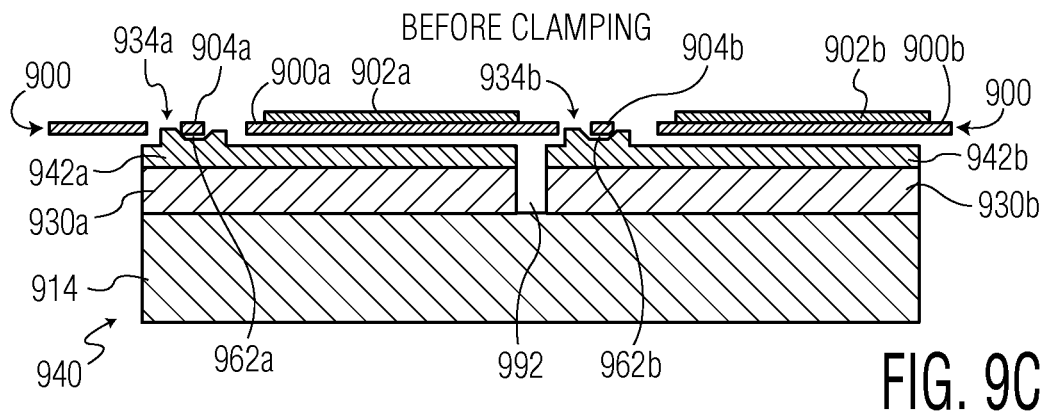
Figure 9D:
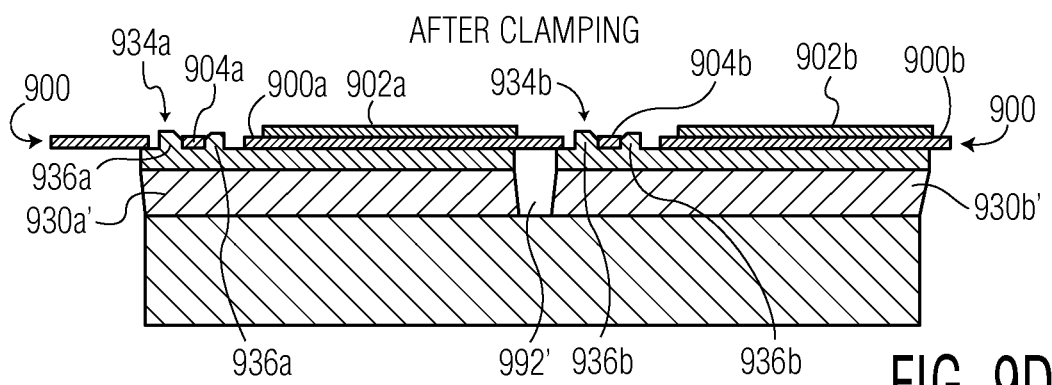

FIGS. 9C-9D illustrate support structure 940 including 2 distinct constraining features 934a, 934b included with (and possibly integrated with) respective top layer portions 942a, 942b, where each of features 934a, 934b is configured to receive a distinct lead 904a, 904b of leadframe 900 within respective valleys 962a, 962b. Leadframe 900 also includes heat sinks 900a, 900b for supporting respective semiconductor dice 902a, 902b. Compliant layer portions 930a, 930b are disposed between base 914 and the respective top layer portions 942a, 942b. Gap 992 is provided between adjacent portion pairs 930a, 932a and 930b, 932b. In FIG. 9C, clamping force has not yet been applied. In FIG. 9D, clamping force has been applied to portions of leadframe 900 to clamp leads 904a, 904b into respective constraining features 934a, 934b (where features 934a, 934b include respective walls 936a, 936b to define respective valleys 962a, 962b). The clamping force creates shear forces in compliant layer portions 930a, 930b, which are now illustrated as flexed compliant layer portions 930a', 930b', thereby distoring gap 992' and allowing top layer portions 942a and 942b to align to the proper position with respect to leadframe portions 904a and 904b.

Further, the example shown in FIGS. 9C-9D is intended to make clear that the support structures (and clamping systems such as device clamps, window clamps, etc.) described herein may be used in connection with a plurality of semiconductor dice at the same time, as is desired. In FIG. 9C, independent compliant portions 930a, 930b are provided below each of semiconductor dice 902a, 902b. These distinct compliant portions 930a, 930b (and respective distinct top layers 942a, 942b) allow for independent motion of each of constraining features 934a, 934b. Of course, a single compliant layer may be provided (e.g., beneath distinct top layers 942a, 942b including distinct constraining features 934a, 934b) for the multiple constraining features, while the compliant layer still maintains enough flexibility in shear to allow for independent alignment of the constraining features with the respective leadframe portions.

Figure 10A:
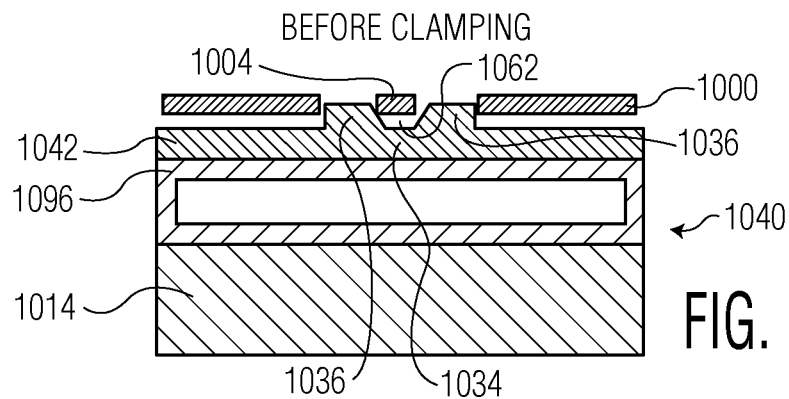
FIGS. 10A-10B are block diagram views illustrating yet another support structure for supporting a semiconductor device in accordance with an exemplary embodiment of the present invention.
Figure 10B:
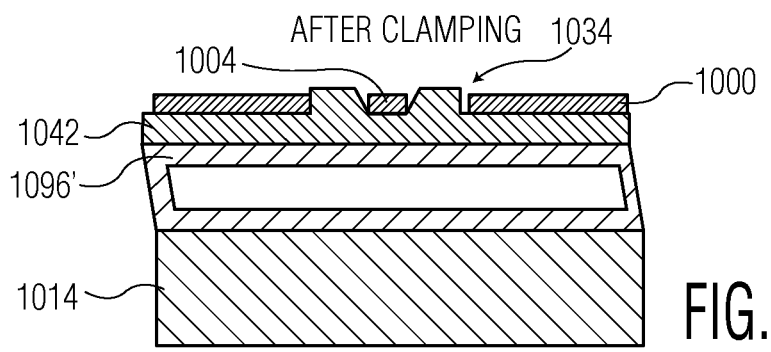

FIGS. 10A-10B are substantially similar to FIGS. 9A-9B except that compliant layer 930 of FIGS. 9A-9B has been replaced by spring structure 1096. While spring structure 1096 is illustrated having a specific shape/size, it is intended to represent any type of spring structure. Support structure 1040 includes base 1014, top layer 1042, and spring structure 1096 disposed therebetween. Top layer 1042 includes (or may integrated with) constraining feature 1034. Feature 1034 includes walls 1036 that define valley 1062 configured to receive lead 1004 of leadframe 1000 (where semiconductor die/dice on leadframe 1000 are not shown for simplicity). In FIG. 10A, clamping force has not yet been applied. In FIG. 10B, clamping force has been applied to leadframe 1000, thereby securing lead 1004 within valley 1062 of constraining feature 1034. FIG. 10B illustrates the effect of shear forces acting upon spring structure 1096 to create flexed spring structure 1096' after seating of lead 1004 into valley 1062. Exemplary variations of this concept include: (1) multiple distinct spring structures provided beneath a leadframe portion supporting a single semiconductor die; (2) a single spring structure provided beneath a leadframe portion supporting a single semiconductor die; and (3) a single spring structure provided beneath a leadframe portion supporting a plurality of semiconductor dice, as is desired in the application.

Figure 11A:
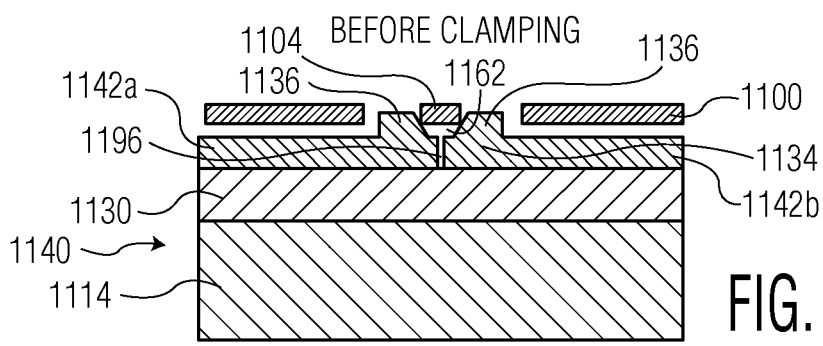
FIGS. 11A-11B are block diagram views illustrating yet another support structure for supporting a semiconductor device in accordance with an exemplary embodiment of the present invention.
Figure 11B:
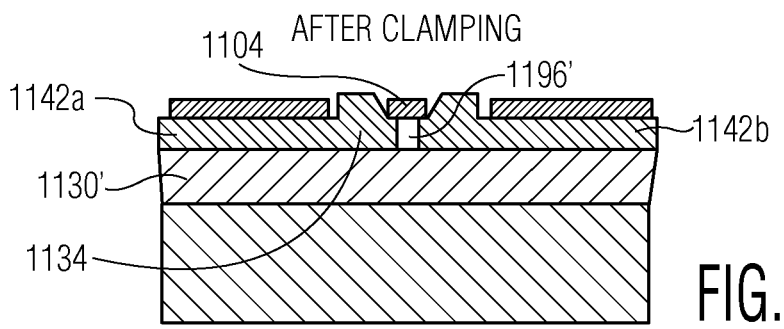

FIGS. 11A-11B are substantially similar to FIGS. 9A-9B except that the top layer is provided as top layer portions 1142a, 1142b which are separated by gap 1196 (which may spread apart under shear) in order to receive leads 1104 of varying sizes/tolerances. The remaining reference numerals in FIGS. 11A-11B correspond to those in FIGS. 9A-9B except that the prefix "9" has been replaced with the prefix "11" (e.g., element 914 in FIG. 9A corresponds to element 1114 in FIG. 11A). FIG. 11B illustrates the effect of applied clamping forces including: (1) seating lead 1104 into valley 1162; (2) spreading apart top layer portions 1142a, 1142b to define widened gap 1196'; and (3) applying shear forces to compliant layer 1130 (now labelled as flexed compliant layer 1130').

As provided above, constraining features according to the present invention may be applied to clamping systems (e.g., device clamps such as window clamps, etc.). FIGS. 12A-12B illustrate an example of such a system. More specifically, constraining feature 1234 is provided on the device clamp 1220 (where constraining feature(s) 1234 may be integrated as part of device clamp 1220, or constraining feature(s) 1234 may be secured to a lower surface of a body portion of device clamp 1220, etc.). Constraining feature 1234 includes walls 1236 defining valley 1262 therebetween configured to accept, for example, lead 1204 of leadframe 1200. Support structure 1240 includes base 1214 (e.g., metallic), compliant pad/layer 1230 (e.g., formed of a visco-elastic polymer), and top layer 1242 (e.g., a thin metal flexible wear pad) which may define features (not shown) desirable for mating with respective portions of leadframe 1200 to provide the desired pressure under clamping. At FIG. 12B, support structure 1240 has been raised so that lead 1204 aligns itself into valley 1262 of wedge shaped constraining feature 1234. Upon clamping pressure applied between support structure 1240 and device clamp 1220 (e.g., by either, or both of elements 1240, 1220), compliant layer 1230 becomes flexed under shear forces (labelled as flexed compliant layer 1230'). Of course, device clamps having constraining features according to the present invention may take on any of a number of configurations (e.g., multiple constraining features on a single device clamp, constraining features having varying shapes/sizes, constraining features having any of the structures described above in connection with FIGS. 3A-3D, 6A-6F, 7A-7D, 8A-8D, 9A-9D, 10A-10B, and 11A-11B such as guides, recesses, gaps, etc.).

As described herein, the constraining features on the support structures or clamping systems may include walls defining a valley configured to receive a portion of a semiconductor device (e.g., a lead of a leadframe supporting a semiconductor die). Such walls are primarily illustrated herein as being downwardly and inwardly sloped to define wedge shaped constraining features. However, the present invention is not so limited. Such walls may have any desired shape/configuration such as straight walls (e.g., that are perpendicular to the surface of the support structure or device clamp), curved walls, stepped walls, amongst others. Further still, a wall defining one edge of a constraining feature may be very different from a wall defining another edge of the constraining feature. For example, FIGS. 8A-8D illustrate a curved wall 862 defining one edge of constraining feature 834, while guides 860 are walls defining the opposite edge of constraining feature 834. Thus, it is clear that any of a number of wall configurations may be utilized.

Although the present invention has been described primarily with respect to certain specific shapes and materials for the support structures and device clamps, it is not limited thereto. The teachings of the present invention may be applicable to a number of different applications. For example, the semiconductor device (including the leadframe) may vary significantly, and as such, the configuration of the constraining features may vary as well. Further, the invention is applicable to devices that do not include a leadframe at all.

As will be appreciated by those skilled in the art, the portion(s) of the semiconductor device (e.g., a lead of a leadframe) constrained by the constraining feature may vary in the manner in which it is constrained. For example, FIGS. 3C-3D illustrate source lead 304 "constrained" by constraining feature 334. It is noted that the lower surface of source lead 304 is not positioned against the lower surface of valley 362. That is, a gap exists even though source lead 304 is desirably constrained. In contrast, FIGS. 9B, 10B, 11B, and 12B illustrate a lower surface of each respective lead (i.e., leads 904, 1004, 1104, and 1204) against the lower surface of the respective valley after clamping. Thus, it is clear that a portion of a semiconductor device (e.g., a lead of a leadframe) may be constrained by the constraining feature even though it is not completely seated at the lower surface of a valley or the like defined by the constraining feature.

Although the invention is illustrated and described herein with reference to specific embodiments, the invention is not intended to be limited to the details shown. Rather, various modifications may be made in the details within the scope and range of equivalents of the claims and without departing from the invention.

What is Claimed:

1. A support structure for supporting a semiconductor device during a bonding operation, the support structure comprising:
    a body portion, the body portion defining an upper surface configured to support a semiconductor device during a bonding operation, the upper surface defining a constraining feature for constraining at least a portion of the semiconductor device during the bonding operation,
    wherein the constraining feature includes a raised portion raised above the upper surface to constrain the portion of the semiconductor device during the bonding operation.

2. The support structure of claim 1 further comprising a base portion wherein the body portion is secured to the base portion during the bonding operation.

3. The support structure of claim 2 wherein the base portion is formed from a first material and the body portion is formed from a second material, the second material being different from the first material.

4. The support structure of claim 3 wherein the base portion is formed from a metallic material and the body portion is formed from an insulative material.

5. The support structure of claim 3 wherein the body portion is formed from a ceramic material.

6. The support structure of claim 3 further comprising a compliant material between the body portion and the base portion.

7. The support structure of claim 2 further comprising a compliant material between the body portion and the base portion.

8. The support structure of claim 1 wherein support structure is an anvil configured for use on a wedge bonding machine.

9. The support structure of claim 1 wherein the raised portion includes substantially parallel raised features to constrain the portion of the semiconductor device during the bonding operation.

10. The support structure of claim 1 wherein the raised portion defines a valley to constrain the portion of the semiconductor device during the bonding operation.

11. The support structure of claim 1 wherein the raised portion includes a plurality of wall portions to at least partially surround, and thereby constrain, the portion of the semiconductor device during the bonding operation.

12. The support structure of claim 1 wherein the semiconductor device includes a leadframe, and wherein the portion of the semiconductor device constrained by the raised feature includes a portion of the leadframe.

13. The support structure of claim 12 wherein the portion of the leadframe constrained by the raised feature includes at least one of a lead, a tie bar, a heat sink, and a die paddle of the leadframe.

14. The support structure of claim 1 wherein the semiconductor device includes a leadframe, and wherein the portion of the semiconductor device constrained during the bonding operation by the constraining feature includes a portion of the leadframe.

15. The support structure of claim 14 wherein the portion of the leadframe constrained by the constraining feature includes at least one of a lead and a tie bar of the leadframe.

16. The support structure of claim 1 wherein the constraining feature is configured to constrain the portion of the semiconductor device in at least one direction.

17. The support structure of claim 16 wherein the at least one direction is a horizontal direction.

18. The support structure of claim 16 wherein the at least one direction includes a direction of ultrasonic scrubbing of a bonding tool motion of a wire bonding machine.

19. The support structure of claim 16 wherein the at least one direction includes at least two directions.

* * * * *